United States Patent
He et al.

(10) Patent No.: US 11,409,933 B2
(45) Date of Patent: Aug. 9, 2022

(54) METHOD FOR DIAGNOSING ANALOG CIRCUIT FAULT BASED ON CROSS WAVELET FEATURES

(71) Applicant: HEFEI UNIVERSITY OF TECHNOLOGY, Anhui (CN)

(72) Inventors: Yigang He, Anhui (CN); Wei He, Anhui (CN); Zhigang Li, Anhui (CN); Lei Zuo, Anhui (CN); Bing Li, Anhui (CN); Liulu He, Anhui (CN)

(73) Assignee: HEFEI UNIVERSITY OF TECHNOLOGY, Anhui (CN)

( * ) Notice: Subject to any disclaimer, the term of this patent is extended or adjusted under 35 U.S.C. 154(b) by 179 days.

(21) Appl. No.: 16/762,926

(22) PCT Filed: Dec. 7, 2017

(86) PCT No.: PCT/CN2017/115011
§ 371 (c)(1),
(2) Date: May 9, 2020

(87) PCT Pub. No.: WO2019/090879
PCT Pub. Date: May 16, 2019

(65) Prior Publication Data
US 2020/0394354 A1    Dec. 17, 2020

(30) Foreign Application Priority Data
Nov. 9, 2017 (CN) .......................... 201711097153.2

(51) Int. Cl.
*G06F 30/367* (2020.01)
*G01R 31/316* (2006.01)

(52) U.S. Cl.
CPC ......... *G06F 30/367* (2020.01); *G01R 31/316* (2013.01)

(58) Field of Classification Search
CPC ............................ G06F 30/367; G01R 31/316
USPC .......................................................... 716/111
See application file for complete search history.

(56) References Cited

U.S. PATENT DOCUMENTS

| 2018/0038909 A1* | 2/2018 | He | G01R 31/316 |
| 2018/0238951 A1* | 8/2018 | Tao | G06K 9/6269 |
| 2019/0353703 A1* | 11/2019 | He | G06F 17/148 |
| 2020/0271720 A1* | 8/2020 | He | G06N 3/006 |
| 2020/0300907 A1* | 9/2020 | He | G01R 31/316 |
| 2021/0293881 A1* | 9/2021 | He | G01R 31/2879 |

* cited by examiner

*Primary Examiner* — Suchin Parihar

(57) ABSTRACT

A method for diagnosing analog circuit fault based on cross wavelet features includes steps of: inputting an excitation signal to an analog circuit under test, and collecting time domain response output signals to form an original data sample set; dividing the original data sample set into a training sample set and a test sample set; performing cross wavelet decomposition on both sets; applying bidirectional two-dimensional linear discriminant analysis to process the wavelet cross spectra of the training sample set and the test sample set, and extracting fault feature vectors of the training sample set and the test sample set; submitting the fault feature vectors of the training sample set to a support vector machine for training an SVM classifier, constructing a support vector machine fault diagnosis model; and inputting the fault feature vectors of the test sample set into the model to perform fault classification.

4 Claims, 2 Drawing Sheets

METHOD FOR DIAGNOSING ANALOG CIRCUIT FAULT BASED ON CROSS WAVELET FEATURES

BACKGROUND OF THE PRESENT INVENTION

Field of Invention

The invention belongs to the technical field of circuit testing, and particularly relates to a method for diagnosing analog circuit fault based on cross wavelet features.

Description of Related Arts

2. DESCRIPTION OF RELATED ART

With the development of integrated circuit technology, large-scale digital-analog hybrid integrated circuits have been widely applied to the fields of consumer electronics, industrial control and aerospace. Analog circuits, as an important constituent part of integrated circuits, used for signal transmission, filter, amplification and conversion are indispensible for normal operation of a system. Therefore, it is necessary to carry out a study on the fault diagnosis technique of analog circuits to ensure the reliability of the system.

However, due to the difficult simulation of analog circuit faults and the influences of non-linearity and tolerance of circuit elements, there are still many problems in fault diagnosis of analog circuits. For example, the disturbance from external noises, the unknown unpredictability of faults and the uncertainty of the deviation of parameters from normal ranges all have a significant influence on the accuracy and efficiency of fault diagnosis methods.

In view of these problems, many domestic and foreign researchers have carried out a great number of studies on fault feature extraction methods. For example, in the literature "Spina R, Upadhyaya S. Linear circuit fault diagnosis using neuromorphic analyzers[J], Circuits & Systems II Analog & Digital Signal Processing IEEE Transactions on, 1997, 44(3): 188-196. Negnevitsky M, Pavlovsky V. Neural networks approach to online identification of multiple failures of protection systems[J], IEEE Transactions on Power Delivery, 2005, 20(2):588-594.", fault response signals of a circuit under test are directly used as inputs of a classifier without being preprocessed, and consequentially, the training time of the classifier is too long, and the structural size is too large. For another example, in the literature "He Xing, Wang Hongli, Lu Jinghui, etc. Analog circuit fault diagnosis method based on preferred wavelet packet and ELM [J]. Chinese Journal of Scientific Instrument, 2013,34 (11): 2614-2619" and the literature "Xiao Yufei, Liu Zurun, Li Mu. Analog circuit fault diagnosis based on wavelet energy entropy and SVM [J], 2011, 34(6):110-113.", the wavelet coefficient energy value or energy entropy is calculated and used as a fault feature to be input to a classifier to realize fault recognition; however, the feature values of nodes are small, and the features cannot be clearly distinguished. For another example, in the literature "Yuan L, He Y, Huang J, et al. A New Neural-Network-Based Fault Diagnosis Approach for Analog Circuits by Using Kurtosis and Entropy as a Preprocessor[J]. IEEE Transactions on Instrumentation & Measurement, 2010, 59(3):586-595. Long Y, Xiong Y, He Y, et al. A new switched current circuit fault diagnosis approach based on pseudorandom test and preprocess by using entropy and Haar wavelet transform [J]. Analog Integrated Circuits & Signal Processing, 2017(3):1-17", the author uses the higher-order statistics of fault response signals as fault features to be input to the classifier to be recognized and obtains a good diagnosis effect; however, the performance of the fault diagnosis method in case of multiple faults (namely the fault categories overlap to a large extent) fails to be taken into consideration.

Thus, it is necessary to work out an analog circuit fault diagnosis method which can effectively improve the circuit fault diagnosis efficiency and can diagnose different types of faults.

SUMMARY OF THE PRESENT INVENTION

The technical issue to be settled by the invention is to overcome the aforementioned defects of the prior art by providing an analog circuit fault diagnosis method based on cross wavelet features, which can effectively improve the circuit fault diagnosis efficiency and can diagnose different types of faults.

The technical solution adopted by the invention to settle the aforesaid technical issue is as follows.

A method for diagnosing analog circuit fault based on cross wavelet features, comprises steps of:

step (1): inputting an excitation signal to an analog circuit under test, and collecting time domain response output signals under a normal condition and time domain response output signals under a fault condition to form an original data sample set, wherein the time domain response output signals under the normal condition and the time domain response output signals under the fault condition are sequentially arrayed in the original data sample set according to a collection sequence;

then, selecting 50% of the time domain response output signals under the normal condition and the domain response output signals under the fault condition from the original data sample set to form a training sample set, and selecting a residual 50% of the time domain response output signals under the normal condition and the time domain response output signals under the fault condition from the original data sample set to form a test sample set;

step (2): performing cross wavelet decomposition on both the training sample set and the test sample set to respectively acquire a wavelet cross spectrum of the training sample set and a wavelet cross spectrum of the test sample set, wherein the wavelet cross spectra is in a form of two-dimensional matrixes;

step (3): applying bidirectional two-dimensional linear discriminant analysis to process the wavelet cross spectrum of the training sample set, extracting fault feature vectors of the training sample set; and applying bidirectional two-dimensional linear discriminant analysis to process the wavelet cross spectrum of the test sample set, extracting fault feature vectors of the test sample set; and step (4): submitting the fault feature vectors of the training sample set to a support vector machine for training an SVM classifier, and constructing a support vector machine fault diagnosis model based on the fault feature vectors of the training sample set; and after the model is trained, inputting the fault feature vectors of the test sample set to the model to perform fault classification.

Furthermore, in the step (2), the wavelet cross spectrum of the training sample set is acquired through steps of:

firstly, performing wavelet decomposition on the time domain output signals under the fault circuit condition and the time domain response output signals under the normal circuit condition in the training sample set to acquire corresponding signal wavelet coefficients which are expressed as:

$$W_x(a, \tau) = \frac{1}{\sqrt{a}} \int_{-\infty}^{+\infty} x(t)\psi^*\left(\frac{t-\tau}{a}\right)dt, a > 0;$$

$$W_y(a, \tau) = \frac{1}{\sqrt{a}} \int_{-\infty}^{+\infty} y(t)\psi^*\left(\frac{t-\tau}{a}\right)dt, a > 0;$$

wherein t is a time point; x(t) is the time domain response output signals under the fault circuit condition in the training sample set, y(t) is the time domain response output signals under the normal circuit condition in the training sample set; α is a scale parameter; τ is a time shift parameter; * is complex number conjugation; ψ is a wavelet basis function; a Monet function is adopted as a basis function and is expressed as:

$$\psi(t) = e^{-t^2/2}e^{j\Omega t};$$

secondly, performing cross processing on the time domain response output signals under the normal circuit condition and the time domain response output signals under the fault circuit condition in the training sample set to acquire the wavelet cross spectrum $S_{x,y}(\alpha, \tau)$ of the training sample set, wherein a process is expressed as:

$$C_{x,y}(\alpha,\tau) W_x(\alpha,\tau) W^*_y(\alpha,\tau);$$

$$S_{x,y}(\alpha,\tau) = C_{x,y}(\alpha,\tau) C^*_{x,y}(\alpha,\tau) = |C_{x,y}(\alpha,\tau)|^2$$

acquiring wavelet cross spectrum of the test sample set in an identical way;

wherein the wavelet cross spectrum of the training sample set and the wavelet cross spectrum of the test sample set are both in a form of a matrix.

Furthermore in step (3) applying bidirectional two-dimensional linear discriminant analysis to process the wavelet cross spectrum of the training sample set to extract fault feature vectors of the training sample set is specifically implemented as:

first, performing dimensionality reduction in a row direction of the matrix, namely the wavelet cross spectrum of the training sample set; wherein suppose there are C types of training samples in the training sample set, M is the number of all training samples in the training sample set, namely the number of all the time domain response output signals in the training sample set, and $M_i$ is the number of the $i^{th}$ type of training samples in the training sample set (namely the number of time domain response output signals corresponding to the $i^{th}$ fault class in the training sample set), $$\left(1 \leq i \leq C, M = \sum_{i=1}^{c} M_i\right);$$

suppose that m*n matrix $A_{ij}$ represents the $j^{th}$ element in the $i^{th}$ type of training samples, an inter-class scatter matrix $S_b$ and an intra-class scatter matrix $S_w$, are defined as:

$$S_b = \frac{1}{M}\sum_{i=1}^{c} M_i(\overline{A}_i - \overline{A})^T(\overline{A}_i - \overline{A})$$

$$S_w = \frac{1}{M}\sum_{i=1}^{c}\sum_{j=1}^{M_i}(A_i - \overline{A})^\gamma(A_{ij} - \overline{A}_i);$$

wherein $A_i$ is a mean of the $i^{th}$ type of training samples in the training sample set, and $\overline{A}$ is a grand mean of all the training samples in the training sample set;

then, resolving d maximum feature values of matrix $S_w^{-1}S_b$ and d corresponding orthogonal feature vectors: $x_1, x_2, \ldots, x_d$, wherein the orthogonal feature vectors $x_1, x_2, \ldots, x_d$ are an optimum projection of the wavelet cross spectrum of the training sample set in the row direction, and d≤(C−1);

a vector set consisting of the orthogonal feature vectors $x_1, x_2, \ldots, x_d$ is an n*d matrix $X=[x_1, x_2, \ldots, x_d]$, and a given m*n sample matrix A is:

$$B=AX;$$

wherein B is a feature matrix of the matrix A and is an m*d matrix;

then, by a two-dimensional linear discriminant analysis (2DLDA) method performing dimensionality reduction in a column direction of the matrix to obtain formulas of:

$$\tilde{S}_b = \frac{1}{M}\sum_{i=1}^{c} M_i(\overline{A}_i - \overline{A})(\overline{A}_i - \overline{A})^P$$

$$\tilde{S}_w = \frac{1}{M}\sum_{i=1}^{c}\sum_{j=1}^{M_i}(A_i - \overline{A}_i)(A_{ij} - \overline{A}_i)^\gamma;$$

then, resolving f maximum feature values of matrix $\tilde{S}_w^{-1}\tilde{S}_b$ and f corresponding orthogonal feature vectors $\tilde{x}_1, \tilde{x}_2, \ldots, \tilde{x}_f$, wherein the orthogonal feature vectors $\tilde{x}_1, \tilde{x}_2, \ldots, \tilde{x}_f$ are an optimum projection of the wavelet cross spectrum of the training sample set in the column direction, and f≤(C−1); a vector set consisting of the orthogonal feature vectors $\tilde{x}_1, \tilde{x}_2, \ldots, \tilde{x}_f$ is an m*f matrix $\tilde{X}=[\tilde{x}_1, \tilde{x}_2, \ldots, \tilde{x}_f]$;

thus, the projection of the sample matrix A in the row and column directions is:

$$Z=\tilde{X}^T AX$$

wherein, Z is a feature matrix extracted from the sample matrix A by means of bidirectional linear discriminant analysis (B2DLDA), and a dimensionality is f*d.

transforming the feature matrix Z extracted by the formula into a one-directional vector to constitute the fault feature vectors of the training sample set;

similarly, by bidirectional two-dimensional linear discriminant analysis, processing the wavelet cross spectrum of the test sample set to extract the fault feature vectors of the test sample set.

In step (4), as described in Literature "Sun Yongkui, Chen Guang, Li Hui. Analog circuit fault diagnosis based on adaptive wavelet decomposition and SVM [J]. Chinese Journal of Scientific Instrument, 2008, 29 (10): 2105-2109", a support vector machine (SVM) fault diagnosis model based on feature vectors of training samples is constructed first, wherein penalty parameters and kernel parameters in the SVM model are obtained by optimization through a grid search method; and after the model is constructed, fault feature vectors of a test sample set is input to the model to recognize fault classes.

According to the invention, output response signals of a circuit under test are processed by means of cross wavelets, and wavelet cross spectra are generated after the output signals are subjected to cross wavelet transform and are stored in the form of two-dimensional matrixes; because the wavelet cross spectra cannot be directly used for training and testing a fault diagnosis model, bidirectional two-dimensional linear discriminant analysis is applied in this invention to extract feature vectors of the wavelet cross spectra to facilitate subsequent training and testing of the fault diagnosis model.

The Invention has the Following Beneficial Effects

According to the invention, useful information in fault signals and normal signals of a circuit under test are comprehensively acquired through cross wavelet transform; compared with conventional signal processing techniques, wavelet cross spectra obtained by cross wavelet transform visually and comprehensively represent the time-frequency-energy information of the signals in the form of images.

B2DLDA is adopted to directly extract the features of image matrixes to clearly distinguish different fault features. Rapid and accurate fault classification is automatically fulfilled through SVM.

Soft-fault and multi-fault simulation experiments of the circuit show that: the method of the invention can distinguish fault response features from normal response features of the analog circuit and can clearly distinguish different fault response features, and essential information of various faults is fully reflected by feature vectors; and fault diagnosis based on SVM is accurate and rapid.

DETAILED DESCRIPTION OF THE PREFERRED EMBODIMENT

The invention is further expounded below in conjunction with the accompanying drawings and preferred embodiments.

1. Fault Diagnosis Method

Figure 1:
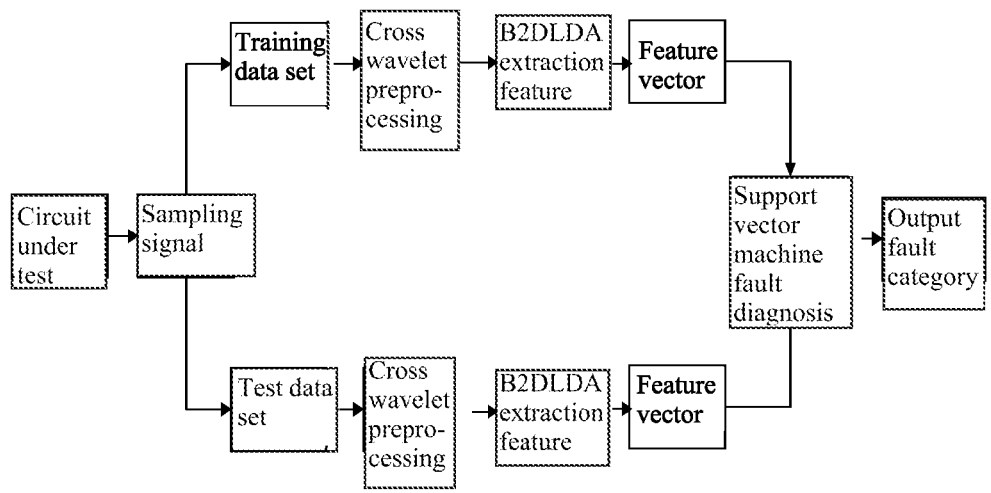
FIG. 1 is an architecture diagram of a fault diagnosis method of the invention.

As shown in FIG. 1, an analog circuit fault diagnosis method based on cross wavelet features specifically comprises following steps of:

Step (1): an excitation signal is input to an analog circuit under test, and time domain response output signals under a normal condition and time domain response output signals under a fault condition are collected to form an original data sample set, wherein the normal time domain response output signals and the fault time domain response output signals are sequentially arrayed in the original data sample set according to the collection sequence; and then, 50% of the normal time domain response output signals and the fault time domain response output signals in the original data sample set are selected to form a training sample set, and the other 50% of the normal time domain response output signals and the fault time domain response output signals in the original data sample set are selected to form a test sample set.

That is, the output response signals of the analog circuit under test are collected through Multisim simulation.

Step (2): cross wavelet decomposition (XWT) is performed on both the training sample set and the test sample set to respectively acquire a wavelet cross spectrum (WCS) of the training sample set and a wavelet cross spectrum of the test sample set, wherein the wavelet cross spectra are stored in a memory of simulation software mat lab in the form of two-dimensional matrixes.

Step (3): bidirectional two-dimensional linear discriminant analysis (B2DLDA) is applied to process the wavelet cross spectrum of the training sample set to extract fault feature vectors of the training sample set, and bidirectional two-dimensional linear discriminant analysis is applied to process the wavelet cross spectrum of the test sample set to extract fault feature vectors of the test sample set.

In this embodiment, the dimensionality reserved in a column direction of B2DLDA is 3, and the dimensionality reserved in the row direction is 2, so that after each fault signal is subjected to feature extraction, each sample corresponds to a six-dimensional feature vector.

Step 4: the fault feature vectors of the training sample set are submitted to a support vector machine (SVM) for training an SVM classifier, and a support vector machine (SVM) fault diagnosis model based on the fault feature vectors of the training sample set is constructed; and after the model is trained, the fault feature vectors of the test sample set are input to the model to perform fault classification.

The core technologies, including cross wavelet transform and bidirectional two-dimensional linear discriminant analysis, of the fault diagnosis method of the invention are further expounded below.

1.1 Cross Wavelet Analysis

Wavelet transform of a finite energy signal x(t) is:

$$W_s(a, \tau) = \frac{1}{\sqrt{a}} \int_{-\infty}^{+\infty} x(t)\psi^*\left(\frac{t-\tau}{a}\right)dt, a > 0;$$

In the formula, a is a scale parameter, $\tau$ is a time shift parameter, and * represents complex number conjugation; $\psi$ is a wavelet basis function; in the invention, a Morlet function is used as the basis function and is expressed as:

$$\psi(t) = e^{-j^2/2}e^{j\Omega t}.$$

Cross-wavelet transform (XWT) of two finite energy signals x(t) and y(t) are:

$$C_{x,y}(\alpha,\tau) = W_x(\alpha,\tau)W^*_y(\alpha,\tau);$$

In an actual application, signal x(t) is set as a fault circuit signal (namely a time domain response output signal under a fault circuit condition), and signal y(t) is set as a response signal under a normal circuit condition (namely a time domain response output signal under the normal circuit condition).

In the invention, a cross wavelet spectrum is adopted to analyze the fault signal and is defined as:

$$S_{x,y}(\alpha,\tau) = C_{x,y}(\alpha,\tau)C^*_{x,y}(\alpha,\tau) = |C_{x,y}(\alpha,\tau)|^2;$$

The one-dimensional signal is expanded in the time domain and the frequency domain through wavelet transform, so that any details of signal transform can be analyzed. Correlation distributions of the two signals in the time and frequency domains are obtained through cross wavelet transform established on the basis of wavelet transform, and the transform coefficient indicates the degree of correlation of the two signals in the time and frequency domains, wherein the larger the transform coefficient is, the closer the correlation of the two signals is. In the invention, the Morlet function is used as the basis function.

1.2 Bidirectional Two-Dimensional Linear Discriminant Analysis (B2DLDA)

Because the wavelet cross spectra obtained by cross wavelet transform are matrixes including complex values and cannot be directly submitted to the SVM classifier for fault diagnosis, the wavelet cross spectra are further process by B2DLDA to extract fault features of data sets corresponding to the WCSs.

B2DLDA is applied to perform dimensionality reduction twice on the matrixes to remove information redundancies in row and column directions of the original matrixes, so that the feature dimensionality is reduced, and feature data that is most favorable for classification is extracted.

Suppose that there are C types of training samples in the training sample set, M is the number of all the time domain response output signals in the training sample set (namely the number of all training samples in the training sample set) and $M_i$ is the number of time domain response output signals corresponding to the $i^{th}$ fault class in the training sample set (namely the number of the $i^{th}$ type of training samples in the training sample set), $$\left(1 \leq i \leq C, M = \sum_{i=1}^{c} M_i\right);$$

suppose m*n matrix $A_{ij}$ represents the $j^{th}$ element in the $i^{th}$ type of training samples, an inter-class scatter matrix $S_b$ and an intra-class scatter matrix $S_w$ are defined as:

$$S_b = \frac{1}{M} \sum_{i=1}^{c} M_i (\overline{A}_i - \overline{A})^T (\overline{A}_i - \overline{A})$$

$$S_w = \frac{1}{M} \sum_{i=1}^{c} \sum_{j=1}^{M_i} (A_{ij} - \overline{A}_i)^T (A_{ij} - \overline{A}_i);$$

In the formulas, $\overline{A}_i$ is the mean of the $i^{th}$ type of training samples in the training sample set, and $\overline{A}$ is the grand mean of all the training samples in the training sample set;

Then, d maximum feature values of matrix $S_w^{-1} S_b$ and d corresponding orthogonal feature vectors: $x_1, x_2, \ldots, x_d$ are resolved, wherein the orthogonal feature vectors $x_1, x_2, \ldots, x_d$ are the optimum projection of the wavelet cross spectrum of the training sample set in the row direction; $d \leq (C-1)$, wherein the specific value of d is determined by a user during example verification.

A vector set consisting of the orthogonal feature vectors $x_1, x_2, \ldots, x_d$ is an m*n matrix $X=[x_1, x_2, \ldots, x_d]$, and a given m*n sample matrix A is:

$$B = Ax;$$

Wherein, B is an m*d matrix and is a feature matrix of the matrix A.

Then, 2DLDA is applied perform projection for dimensionality reduction in the column direction of the matrix, and similarly, the following formulas are obtained:

$$\tilde{S}_b = \frac{1}{M} \sum_{i=1}^{c} M_i (\overline{A}_i - \overline{A})(\overline{A}_i - \overline{A})^T$$

$$\tilde{S}_w = \frac{1}{M} \sum_{i=1}^{c} \sum_{j=1}^{M_i} (A_{ij} - \overline{A}_j)(A_{ij} - \overline{A}_j)^T;$$

Then, f maximum feature values of matrix $\tilde{S}_w^{-1} \tilde{S}_b$ and f corresponding orthogonal feature vectors $\tilde{x}_1, \tilde{x}_2, \ldots, \tilde{x}_f$ are resolved, wherein the orthogonal feature vectors $\tilde{x}_1, \tilde{x}_2, \ldots, \tilde{x}_f$ are the optimum projection of the wavelet cross spectrum of the training sample set in the column direction, and $f \leq (C-1)$; a vector set consisting of the orthogonal feature vectors $\tilde{x}_1, \tilde{x}_2, \ldots, \tilde{x}_f$ is an m*f matrix $\tilde{X}=[\tilde{x}_1, \tilde{x}_2, \ldots, \tilde{x}_f]$, wherein the specific value of f is determined by the user during example verification.

In this way, the optimum projection of the sample matrix A in the row and column directions is:

$$Z = \tilde{X}^T A X$$

Wherein, Z is a feature matrix extracted from the matrix A by means of B2DLDA, and the dimensionality is f*d.

The feature matrix extracted by the formula is transformed into a one-directional vector to constitute the fault feature vectors of the training sample set.

The fault feature vectors of the test sample set can be extracted in the same way.

2 Circuit Case and Method Application:

With two typical fault circuits as examples, the application of the method of the invention to fault diagnosis of a video amplifier circuit with hard faults and a four-operational amplifier low pass filter circuit with multiple faults is explained below.

Figure 2:
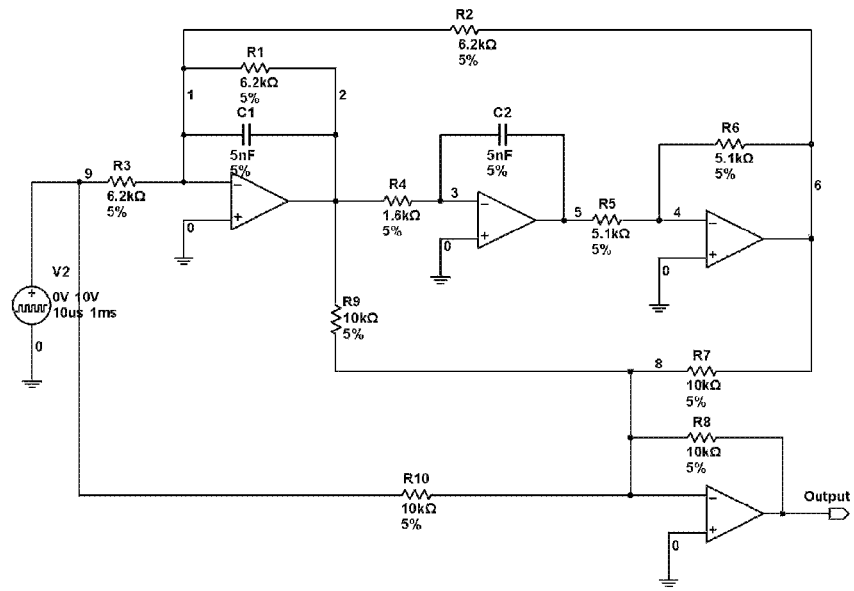
FIG. 2 is a diagram of a four-operational amplifier low pass filter circuit.

2.1 Fault Circuit:

Case: the fault circuit adopted in the invention is a four-operational amplifier high-pass filter circuit shown in FIG. 2, and nominal values of all elements of are marked out in the figure. Herein, the whole process of the fault diagnosis method provided by the invention is illustrated with this circuit an example, wherein a pulse wave with a duration of 10 us and a voltage of 10V is used as an excitation source, and fault time domain response signals are sampled at the output terminal of the circuit. The resistance and capacitance of this circuit are set to 5%.

R1, R2, R3, R4, C1 and C2 are selected as test objects. Table 1 shows the fault codes, fault categories, nominal values and fault values of the test elements in the circuit, wherein ↑ represents that the fault value is greater than the nominal value, and ↓ represents that the fault value is lower than the nominal value, and no fault is also regarded as a fault with the fault code F0. 60 data is sampled for each fault category (normal condition and fault condition) and is divided into two parts, wherein the front 30 to data is used to construct a fault diagnosis model, and the last 30 data is used to test the performance of the fault diagnosis model.

TABLE 1

| Fault code | Fault category | Fault value | Fault code | Fault category | Fault value |
|---|---|---|---|---|---|
| F1 | R1 ↓ | 3000 Ω | F2 | R1 ↑ | 15000Ω |
| F3 | R2 ↓ | 2000Ω | F4 | R2 ↑ | 18000Ω |
| F5 | R3 ↓ | 2700Ω | F6 | R3 ↑ | 12000Ω |
| F7 | R4 ↓ | 500Ω | F8 | R4 ↑ | 2500Ω |
| F9 | C1 ↓ | 2.5 nF | F10 | C1 ↑ | 10 nF |
| F11 | C2 ↓ | 1.5 nF | F12 | C2 ↑ | 15 nF |
| F13 | C1 ↑C2↓ | — | F14 | R1↑C2↓ | — |
| F15 | R1 ↑R2↓ | — | F16 | R2↑R4↓ | — |

Step (1):

A pulse train with a voltage of 10V and a duration of 10 us is used as an excitation response to be applied to a four-operational amplifier biquadratic high pass filter circuit, output responses of the circuit in different fault modes are simulated through Multisim, time domain response output signals are collected to form an original data sample set, and the original data sample set is divided into a training sample set and a test sample set.

Step (2):

Then, cross wavelet transform is adopted to analyze the output responses of the circuit to acquire a cross wavelet spectrum matrix of the training sample set and a cross wavelet spectrum matrix of the test sample set, wherein a complex morlet wavelet is used as the wavelet basis of cross wavelet transform; and considering that the cross wavelet spectra are complex negative matrixes which are difficult to further process, the amplitudes of complex elements in the matrixes are resolved in the invention to constitute new cross spectrum matrixes.

Step (3):

Bidirectional two-dimensional linear discriminant analysis is performed on the matrixes to extract fault feature vectors of the training sample set and fault feature vectors of the test sample set, and dimensionality reduction is performed in row and column directions of the matrixes, wherein the dimensionality reserved in the column direction by B2DLDA meets f=3, and the dimensionality reserved in the row direction by B2DLDA meets d=2, so that each sample corresponds to a six-dimensional feature vector.

Figure 3:
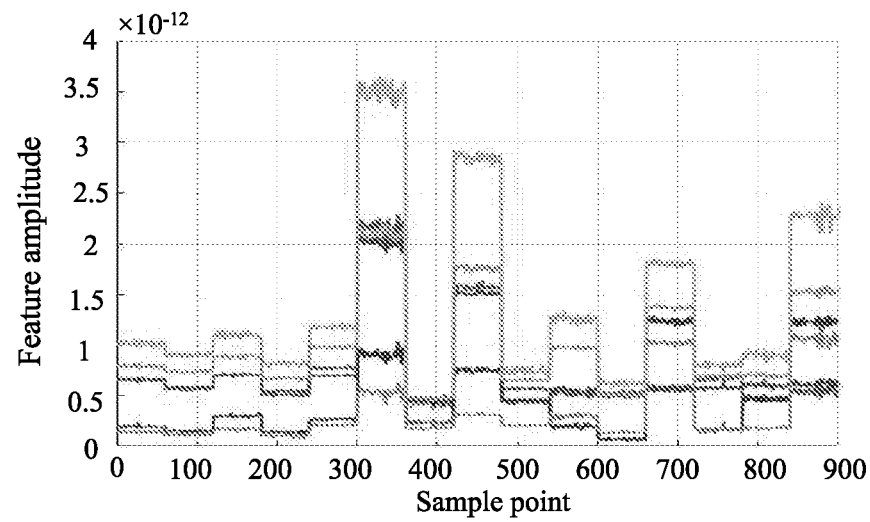
FIG. 3 is a fault feature diagram of the four-operational amplifier low pass filter circuit.

If the feature value difference between different faults or between the fault condition and the normal condition is larger, the signal response difference between different faults or between the fault condition and the normal condition will be more obvious, and the fault features will be more favorable for fault diagnosis. As can be seen from FIG. 3, by the adoption of the method of the invention, the values of response features under the fault circuit condition and the values of response features under the normal circuit condition are drastically different, and the feature values in different fault modes are also drastically different, which fully demonstrates the validity of fault feature extraction of the invention.

Figure 4:
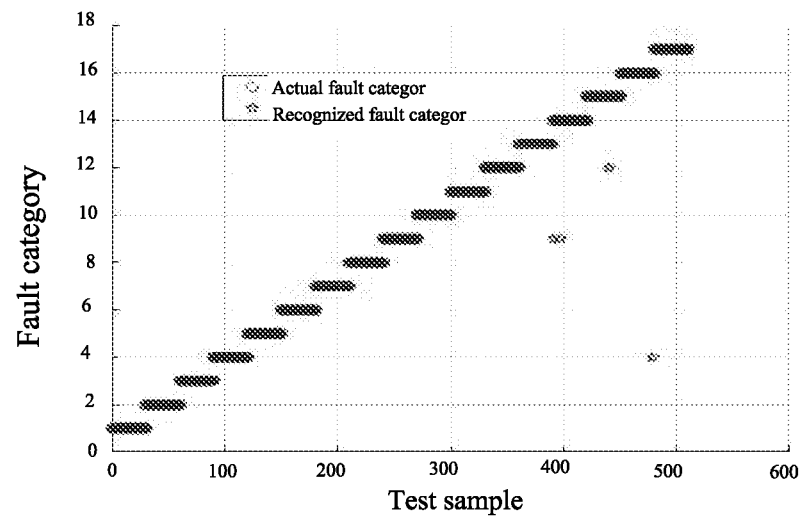
FIG. 4 is a fault classification diagram of a four-operational amplifier low pass filter.

Step (4):

The fault feature vectors of the training sample set are input to a SVM for training a classification model, and after the model is trained, and the fault feature vectors of the test sample set are input to the SVM classifier model to obtain a fault diagnosis result shown in FIG. 4. The SVM model successfully recognizes most faults, and the overall diagnosis accuracy of faults reaches 99.22%.

What is claimed is:

1. A method for diagnosing analog circuit fault based on cross wavelet features, comprising steps of:

step (1): inputting an excitation signal to an analog circuit under test, and collecting time domain response output signals under a normal condition and time domain response output signals under a fault condition to form an original data sample set, wherein the time domain response output signals under the normal condition and the time domain response output signals under the fault condition are sequentially arrayed in the original data sample set according to a collection sequence;

then, selecting 50% of the time domain response output signals under the normal condition and the domain response output signals under the fault condition from the original data sample set to form a training sample set, and selecting a residual 50% of the time domain response output signals under the normal condition and the time domain response output signals under the fault condition from the original data sample set to form a test sample set;

step (2): performing cross wavelet decomposition on both the training sample set and the test sample set to respectively acquire a wavelet cross spectrum of the training sample set and a wavelet cross spectrum of the test sample set, wherein the wavelet cross spectra is in a form of two-dimensional matrixes;

step (3): applying bidirectional two-dimensional linear discriminant analysis to process the wavelet cross spectrum of the training sample set, extracting fault feature vectors of the training sample set; and applying bidirectional two-dimensional linear discriminant analysis to process the wavelet cross spectrum of the test sample set, extracting fault feature vectors of the test sample set; and step (4): submitting the fault feature vectors of the training sample set to a support vector machine for training an SVM classifier, and constructing a support vector machine fault diagnosis model based on the fault feature vectors of the training sample set; and after the model is trained, inputting the fault feature vectors of the test sample set to the model to perform fault classification.

2. The method for diagnosing analog circuit fault based on cross wavelet features according to claim 1, wherein in step (2), the wavelet cross spectrum of the training sample set is acquired through steps of:

firstly, performing wavelet decomposition on the time domain output signals under the fault circuit condition and the time domain response output signals under the normal circuit condition in the training sample set to acquire corresponding signal wavelet coefficients which are expressed as:

$$W_x(a, \tau) = \frac{1}{\sqrt{a}} \int_{-\infty}^{+\infty} x(t)\psi^*\left(\frac{t-\tau}{a}\right)dt, a > 0;$$

$$W_y(a, \tau) = \frac{1}{\sqrt{a}} \int_{-\infty}^{+\infty} y(t)\psi^*\left(\frac{t-\tau}{a}\right)dt, a > 0;$$

wherein t is a time point; $x(t)$ is the time domain response output signals under the fault circuit condition in the training sample set, $y(t)$ is the time domain response output signals under the normal circuit condition in the training sample set; $\alpha$ is a scale parameter; $\tau$ is a time shift parameter; * is complex number conjugation; $\psi$ is a wavelet basis function; a Monet function is adopted as a basis function and is expressed as:

$$\psi(t) = e^{-t^2/2} e^{j\Omega t};$$

secondly, performing cross processing on the time domain response output signals under the normal circuit condition and the time domain response output signals under the fault circuit condition in the training sample set to acquire the wavelet cross spectrum $S_{x,y}(\alpha, \tau)$ of the training sample set, wherein a process is expressed as:

$$C_{x,y}(a, \tau) = W_A(a, \tau) W_y^*(a, \tau);$$
$$S_{x,y}(a, \tau) = C_{x,y}(a, \tau) C_{x,y}^*(a, \tau) |C_{x,y}(a, \tau)|^2;$$

acquiring wavelet cross spectrum of the test sample set in an identical way;

wherein the wavelet cross spectrum of the training sample set and the wavelet cross spectrum of the test sample set are both in a form of a matrix.

3. The analog circuit fault diagnosis method based on cross wavelet features according to claim 1, wherein in step (3), applying bidirectional two-dimensional linear discriminant analysis to process the wavelet cross spectrum of the training sample set to extract fault feature vectors of the training sample set is specifically implemented as:

first, performing dimensionality reduction in a row direction of the matrix, namely the wavelet cross spectrum of the training sample set; wherein suppose there are C types of training samples in the training sample set, M is the number of all training samples in the training sample set, namely the number of all the time domain response output signals in the training sample set, and $M_i$ is the number of the $i^{th}$ type of training samples in the training sample set (namely the number of time domain response output signals corresponding to the fault class in the training sample set), $$\left(1 \leq i \leq C, M = \sum_{i=1}^{c} M_i\right);$$

suppose that m*n matrix $A_{ij}$ represents the $j^{th}$ element in the $i^{th}$ type of training samples, an inter-class scatter matrix $S_b$ and an intra-class scatter matrix $S_w$, are defined as:

$$S_b = \frac{1}{M} \sum_{i=1}^{c} M_i (\overline{A}_i - \overline{A})^T (\overline{A}_i - \overline{A})$$
$$S_w = \frac{1}{M} \sum_{i=1}^{c} \sum_{j=1}^{M_i} (A_{ij} - \overline{A}_i)^T (A_{ij} - \overline{A}_i);$$

wherein $A_i$ is a mean of the $i^{th}$ type of training samples in the training sample set, and $\overline{A}$ is a grand mean of all the training samples in the training sample set;

then, resolving d maximum feature values of matrix $S_w^{-1} S_b$ and d corresponding orthogonal feature vectors: $x_1, x_2, \ldots, x_d$, wherein the orthogonal feature vectors $x_1, x_2, \ldots, x_d$ are an optimum projection of the wavelet cross spectrum of the training sample set in the row direction, and $d \leq (C-1)$;

a vector set consisting of the orthogonal feature vectors $x_1, x_2, \ldots, x_d$ is an n*d matrix $X = [x_1, x_2, \ldots, x_d]$, and a given in m*n sample matrix A is:

$$B = AX;$$

wherein B is a feature matrix of the matrix A and is an in m*d matrix;

then, by a two-dimensional linear discriminant analysis (2DLDA) method performing dimensionality reduction in a column direction of the matrix to obtain formulas of:

$$\tilde{S}_b = \frac{1}{M} \sum_{i=1}^{c} M_i (\overline{A}_i - \overline{A})(\overline{A}_i - \overline{A})^T$$
$$\tilde{S}_w = \frac{1}{M} \sum_{i=1}^{c} \sum_{j=1}^{M_i} (A_{ij} - \overline{A}_j)(A_{ij} - \overline{A}_j)^T;$$

then, resolving f maximum feature values of matrix $\tilde{S}_w^{-1} \tilde{S}_b$ and f corresponding orthogonal feature vectors $\tilde{x}_1, \tilde{x}_2, \ldots, \tilde{x}_f$; wherein the orthogonal feature vectors $\tilde{x}_1, \tilde{x}_2, \ldots, \tilde{x}_f$ are an optimum projection of the wavelet cross spectrum of the training sample set in the column direction, and $f \leq (C-1)$; a vector set consisting of the orthogonal feature vectors $\tilde{x}_1, \tilde{x}_2, \ldots, \tilde{x}_f$ is an m*f matrix $\tilde{X} [\tilde{x}_1, \tilde{x}_2, \ldots, \tilde{x}_f]$;

thus, the projection of the sample matrix A in the row and column directions is:

$$Z = \tilde{X}^T A X;$$

wherein, Z is a feature matrix extracted from the sample matrix A by means of bidirectional two-dimensional linear discriminant analysis (B2DLDA), and a dimensionality is f*d, transforming the feature matrix Z extracted by the formula into a one-directional vector to constitute the fault feature vectors of the training sample set;

similarly, by bidirectional two-dimensional linear discriminant analysis, processing the wavelet cross spectrum of the test sample set to extract the fault feature vectors of the test sample set.

4. The analog circuit fault diagnosis method based on cross wavelet features according to claim 2, wherein in step (3), applying bidirectional two-dimensional linear discriminant analysis to process the wavelet cross spectrum of the training sample set to extract fault feature vectors of the training sample set is specifically implemented as:

first, performing dimensionality reduction in a row direction of the matrix, namely the wavelet cross spectrum of the training sample set; wherein suppose there are C types of training samples in the training sample set, M is the number of all training samples in the training sample set, namely the number of all the time domain response output signals in the training sample set, and $M_i$ is the number of the $i^{th}$ type of training samples in the training sample set (namely the number of time domain response output signals corresponding to the $i^{th}$ fault class in the training sample set), $$\left(1 \leq i \leq C_i M = \sum_{i=1}^{s} M_i\right);$$

suppose that m*n matrix $A_{ij}$ represents the $j^{th}$ element in the $i^{th}$ type of training samples, an inter-class scatter matrix $S_b$ and an intra-class scatter matrix $S_w$ are defined as:

$$S_b = \frac{1}{M}\sum_{i=1}^{c} M_i(\overline{A}_i - \overline{A})^T(\overline{A}_i - \overline{A})$$

$$S_w = \frac{1}{M}\sum_{i=1}^{c}\sum_{j=1}^{M_i}(A_{ij} - \overline{A}_i)^T(A_{ij} - \overline{A}_i);$$

wherein $A_i$ is a mean of the $i^{th}$ type of training samples in the training sample set, and $\overline{A}$ is a grand mean of all the training samples in the training sample set;

then, resolving d maximum feature values of matrix $S_w^{-1}S_b$ and d corresponding orthogonal feature vectors: $x_1, x_2, \ldots, x_d$, wherein the orthogonal feature vectors $x_1, x_2, \ldots, x_d$ are an optimum projection of the wavelet cross spectrum of the training sample set in the row direction, and $d \leq (C-1)$;

a vector set consisting of the orthogonal feature vectors $x_1, x_2, \ldots, x_d$ is an n*d matrix $X=[x_1, x_2, \ldots, x_d]$, and a given m*n sample matrix A is:

$$B=AX;$$

wherein B is a feature matrix of the matrix A and is an m*d matrix;

then, by a two-dimensional linear discriminant analysis (2DLDA) method performing dimensionality reduction in a column direction of the matrix to obtain formulas of:

$$\overline{S}_b = \frac{1}{M}\sum_{i=1}^{c} M_i(\overline{A}_i - \overline{A})(\overline{A}_i - \overline{A})^T$$

$$\overline{S}_w = \frac{1}{M}\sum_{i=1}^{c}\sum_{j=1}^{M_i}(A_{ij} - \overline{A}_j)(A_{ij} - \overline{A}_j)^Y;$$

then, resolving f maximum feature values of matrix $\dot{S}_w^{-1}S_b$ and f corresponding orthogonal feature vectors, $\tilde{x}_1, \tilde{x}_2, \ldots, \tilde{x}_f$ wherein the orthogonal feature vectors $\tilde{x}_1, \tilde{x}_2, \ldots, \tilde{x}_f$ are an optimum projection of the wavelet cross spectrum of the training sample set in the column direction, and $f \leq (C-1)$; a vector set consisting of the orthogonal feature vectors $\tilde{x}_1, \tilde{x}_2, \ldots, \tilde{x}_f$ is an m*f matrix $\hat{X}=[\tilde{x}_1, \tilde{x}_2, \ldots, \tilde{x}_f]$;

thus, the projection of the sample matrix A in the row and column directions is:

$$Z=\tilde{X}^T AX$$

wherein, Z is a feature matrix extracted from the sample matrix A by means of bidirectional two-dimensional linear discriminant analysis (B2DLDA), and a dimensionality is f*d, transforming the feature matrix Z extracted by the formula into a one-directional vector to constitute the fault feature vectors of the training sample set;

similarly, by bidirectional two-dimensional linear discriminant analysis, processing the wavelet cross spectrum of the test sample set to extract the fault feature vectors of the test sample set.

\* \* \* \* \*